United States Patent [19]
Kitamura et al.

[11] Patent Number: 5,939,715
[45] Date of Patent: Aug. 17, 1999

[54] SCANNING PROBE MICROSCOPE

[75] Inventors: Shinichi Kitamura, Saitama; Takashi Sueyoshi, Tokyo, both of Japan

[73] Assignee: Jeol Ltd., Tokyo, Japan

[21] Appl. No.: 09/031,641

[22] Filed: Feb. 27, 1997

[51] Int. Cl.$^6$ ............................................. H01J 3/14
[52] U.S. Cl. ................................. 250/234; 250/306
[58] Field of Search .................................... 250/234, 306, 250/201.3, 307

[56] References Cited

U.S. PATENT DOCUMENTS 5,308,974   5/1994   Elings et al. .................... 250/234
5,465,046  11/1995   Campbell et al. ................ 324/244

OTHER PUBLICATIONS

C. Schönenberger et al ., "Separation of magnetic and topographic effects in force microscopy", *J. Appl. Phys.*, 67 (12), Jun. 15, 1990, pp. 7278–7280.

*Primary Examiner*—Que T. Le
*Attorney, Agent, or Firm*—Webb Ziesenheim Logsdon Orkin & Hanson, P.C.

[57] ABSTRACT

There is disclosed a scanning probe microscope capable of producing a topographic image and a magnetic image of a surface of a sample in one measurement. The microscope has a probe tip made of a magnetic material. A physical force, such as an atomic force, is exerted between the probe tip and the sample. When this physical force does not act on the probe tip, it vibrates at a first vibrational frequency. Displacements of the probe tip are detected by a photodetector. A topographic information-extracting portion including a voltage-to-current converter, a phase shifter, an FM demodulator, a low-pass filter, and an error amplifier extracts a signal representative of topographic information from the output from the photodetector. A magnetic distribution-extracting portion, including an oscillator and a lock-in amplifier, extracts information about the magnetism of the sample from the output from the photodetector.

6 Claims, 3 Drawing Sheets

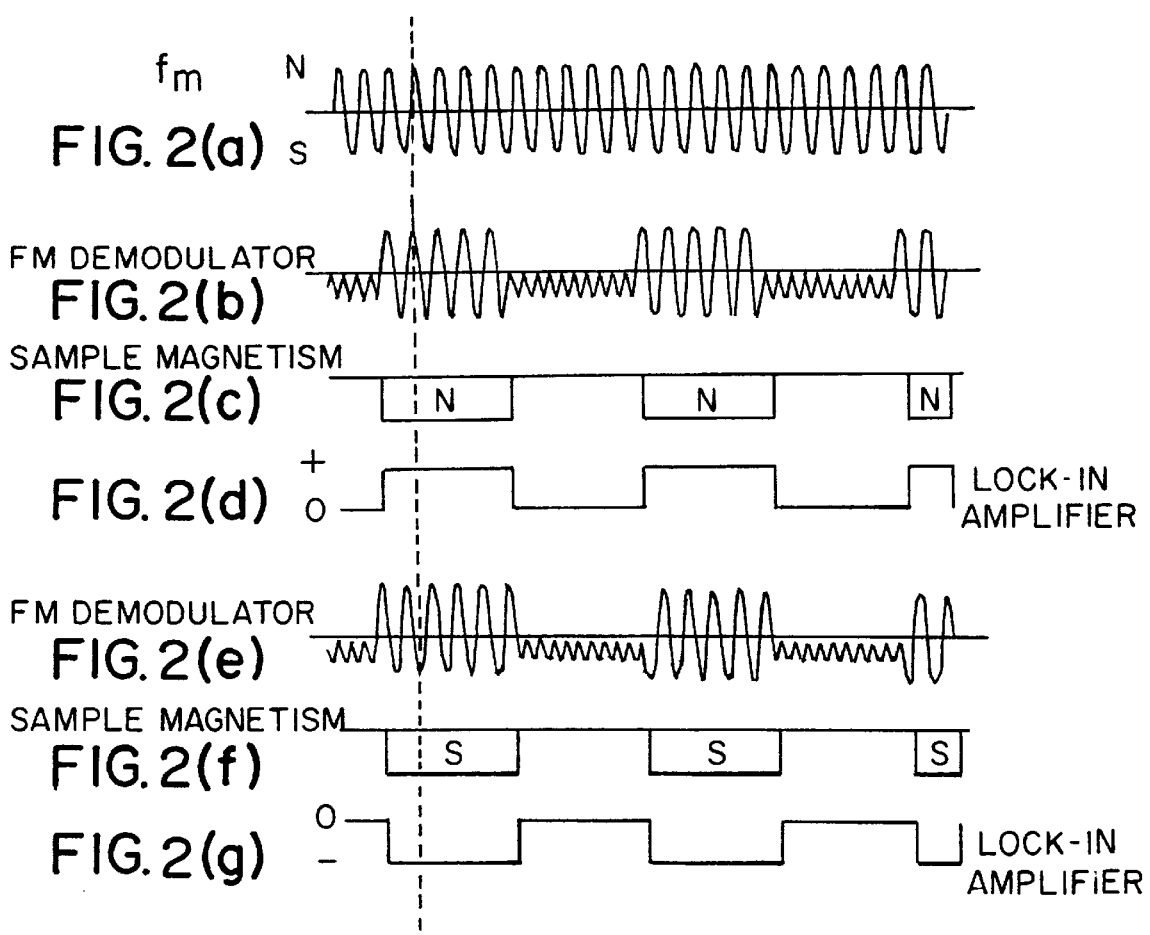

SCANNING PROBE MICROSCOPE

FIELD OF THE INVENTION

The present invention relates to a scanning probe microscope capable of obtaining a topographic image and a magnetic image of the surface of a sample in one measurement, provided that the sample consists of a magnetic material.

BACKGROUND OF THE INVENTION

Scanning tunneling microscopes, scanning atomic force microscopes, and similar other microscopes are collectively known as scanning probe microscopes (SPMs). It is known that a scanning probe microscope is used to permit one to observe the topography of a sample surface as a two-dimensional image (i.e., to generate a topographic image) or to image various kinds of physical forces, such as an atomic force or a magnetic force exerted between a sample and a probe tip.

Various methods are known to derive topographic images of sample surfaces. One of them is known as the slope detection method. One example of instrumentation for effecting this method is shown in FIG. 3. Shown in this figure are a cantilever 1, a probe tip 2, a sample 3, piezoelectric scanning elements 4x, 4y, 4z, a laser 5 acting as a light source, a reflecting mirror 6, a detector 7, an IV (current-to-voltage) amplifier 8, a lock-in amplifier (LIA) 9, an error amplifier 10, driving power supplies 11, 12, a scanning driver portion 13, a control portion 14, a display portion 15, a piezoelectric device 16, and an oscillator 17.

The probe tip 2 is formed at the front end of the cantilever 1. The probe tip 2 and the sample 3 are positioned opposite to each other. The laser 5 is located above the cantilever 1. Laser light emitted from the laser 5 is reflected by the top surface of the cantilever 1, is reflected by the reflecting mirror 6, and impinges on the detector 7.

For example, the detector 7 comprises a photodetector split into four parts A–D, as shown in FIG. 4. A change in the position hit by the laser light can be detected from the state of balance between the amounts of light impinging on the two pairs of parts A–D of the detector. If the probe tip 2 is brought close to the sample 3, a physical force (such as an atomic force or a magnetic force) produced between the atoms at the probe tip 2 and the atoms on the surface of the sample 3 acts to deflect the cantilever 1. It is well known that a change in the position hit by the reflected laser light induced by the vertical deflection of the cantilever 1 can be sensed by comparing the amount of light impinging on one detector part pair (A+B) with the amount of light impinging on the other detector part pair (C+D).

Assume that the detector 7 includes a calculational means for performing given calculations on the output signals from the two pairs of parts of the detector. In this case, this detector 7 performs the following calculation:

$$((A+B)-(C+D))/((A+B)+(C+D)) \qquad (1)$$

The piezoelectric device 16 is attached to a member that supports the cantilever 1. This piezoelectric device 16 is vibrated by a signal generated from the oscillator 17. That is, the cantilever 1 is forced to vibrate by the piezoelectric device 16. The oscillation frequency of the oscillator 17 is set close to the resonance frequency of the cantilever 1.

Referring still to FIG. 3, the output current from the detector 7 is converted into a voltage by the IV amplifier 8 and phase detected by the lock-in amplifier 9 by reference to the output signal from the oscillator 17. The output signal from the lock-in amplifier 9 is fed to one input terminal of the error amplifier 10. A preset reference voltage $V_{REF}$ is applied to the other input terminal of the error amplifier 10. This error amplifier 10 produces the difference between these two input signals.

The output signal from the error amplifier 10 is supplied to the control portion 14 and to the driving power supply 11. The error amplifier 10 controls the piezoelectric scanning element 4z for z motion via the driving power supply 11 so that the output signal from the lock-in amplifier 9 equals the reference voltage $V_{REF}$. Therefore, the distance between the cantilever 1 and the surface of the sample 3 is always held to a distance corresponding to the reference voltage $V_{REF}$. That is, the piezoelectric scanning element 4z for z motion is controlled by the signal fed back to it so that the distance between the probe tip 2 and the sample 3 is kept constant.

The control portion 14 creates a topographic image of the sample 3 from the output signal from the error amplifier 10 and displays the image on the display portion 15. Also, the control portion 14 controls the scanning driver portion 13 to scan the sample 3 in two dimensions within the x-y plane. In particular, the scanning driver portion 13 produces a signal for two-dimensional scanning to the driving power supply 12 under control of the control portion 14. In response to this signal, the power supply 12 supplies signals to piezoelectric elements 4x and 4y for x and y motions, respectively.

In this way, a topographic image of the surface of the sample 3 is derived. Where the sample 3 is made of a magnetic material, it is desired to know the magnetic distribution on the sample 3, in addition to having the topographic image. Accordingly, a method for creating a visible two-dimensional image from the magnetic distribution on the sample has been developed.

An example of this is given now. Where the magnetic force should be detected, the probe tip needs to be made of a magnetic material. For this purpose, it is common practice to fabricate the probe tip itself from a magnetic material or to coat a magnetic material on the probe tip.

Where the probe tip is simply fabricated from a magnetic material as described above, the probe tip undergoes an attractive force irrespective of the magnetic polarization characteristics of the surface of the sample. Specifically, the probe tip is attracted, whether the sample surface is south pole or north pole, and therefore the probe tip receives an attractive force. Of course, the variations in the magnetic force can be converted into an image of plural gray levels by detecting the motion of the cantilever responsive to the attractive force. However, it is impossible to know the polarity.

Accordingly, the cantilever, its support member, and the probe tip are all fabricated from a magnetic material as described above. A conductive wire is wound around the support member 18 for the cantilever 1 to form a coil 19, as shown in FIGS. 5(a) and 5(b). An electrical current is fed to the coil 19 from a power supply (not shown in FIGS. 5(a) and 5(b)), thus magnetizing the cantilever 1 and the probe tip 2. Note that FIG. 5(a) is a plan view, while FIG. 5(b) is a side elevation.

Where the probe tip 2 magnetized in this manner is used, variations in the magnetic polarization characteristics of the surface of the sample produce an attractive or repulsive force acting on the probe tip 2, thus moving the cantilever 1 up and down. By detecting this motion of the cantilever 1, an image of various gray levels can be created from the magnetic polarization characteristic distribution of the surface of the sample. This image will be hereinafter referred to as a magnetic image.

Where a topographic image is derived with the structure shown in FIG. 3, the piezoelectric scanning element 4z for z motion is controlled according to the signal fed back to it from the error amplifier 10 to maintain constant the distance between the probe tip 2 and the sample 3. Where a magnetic image is produced, it is necessary to detect only the vertical motion of the cantilever 1 without providing the feedback control of the piezoelectric scanning element 4z. This means that where a topographic image and a magnetic image should be obtained from the same sample, two separate measurements must be performed.

SUMMARY OF THE INVENTION

The present invention is intended to solve the foregoing problem.

It is an object of the present invention to provide a scanning probe microscope capable of producing a topographic image and a magnetic image simultaneously in one measurement.

The above-described object is achieved in accordance with the teachings of the present invention by a scanning probe microscope for placing a probe tip opposite to a sample, scanning the probe tip or the sample in two dimensions to produce a physical force therebetween, detecting an amount of displacement of the probe tip relative to the sample due to the physical force, and creating a sample image from a signal representative of the detected amount of displacement, the scanning probe microscope comprising: the probe tip consisting of a magnetic material and vibrating at a first vibrational frequency when the physical force does not act on the probe tip; a first detection means for detecting the displacements of the probe tip and producing an output signal representative of the displacements; a second detection means for extracting a signal representative of topography of a surface of the sample from the output signal from the first detection means; a means for displaying a topographic image of the sample according to an output signal from the second detection means; a magnetic field application means for applying an alternating magnetic field having a frequency different from the first vibrational frequency to the probe tip; a third detection means for extracting a signal associated with magnetism of the sample from the output signal from the first detection means; and a means for displaying a magnetic image of the surface of the sample from an output signal from the third detection means.

Other objects and features of the invention will appear in the course of the description thereof, which follows.

BRIEF DESCRIPTION OF THE DRAWINGS

FIGS. 2(a), 2(b) and 2(d) are waveform diagrams for the oscillator, the FM demodulator and the lock-in amplifier to be understood with the magnetic surface condition illustrated in FIG. 2(c), illustrating the operation of the microscope shown in FIG. 1 when the magnetic image is obtained;

FIGS. 2(e) and 2(g) are waveform diagrams for the FM demodulator and lock-in amplifier to be understood with the magnetic surface condition illustrated in FIG. 2(f);

DESCRIPTION OF THE PREFERRED EMBODIMENT

Figure 1:
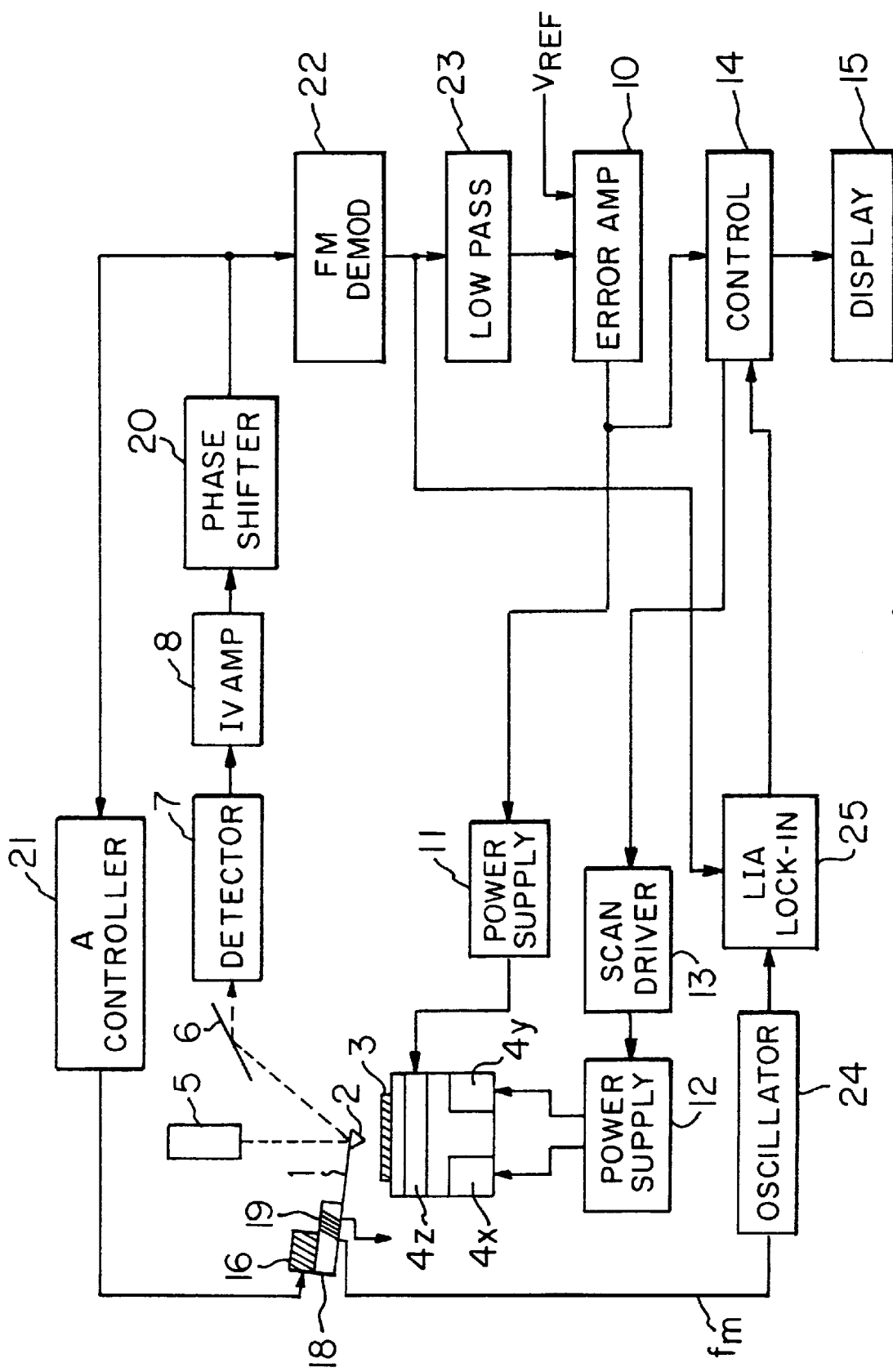
FIG. 1 is a block diagram of a scanning probe microscope in accordance with the present invention.
Figure 3:
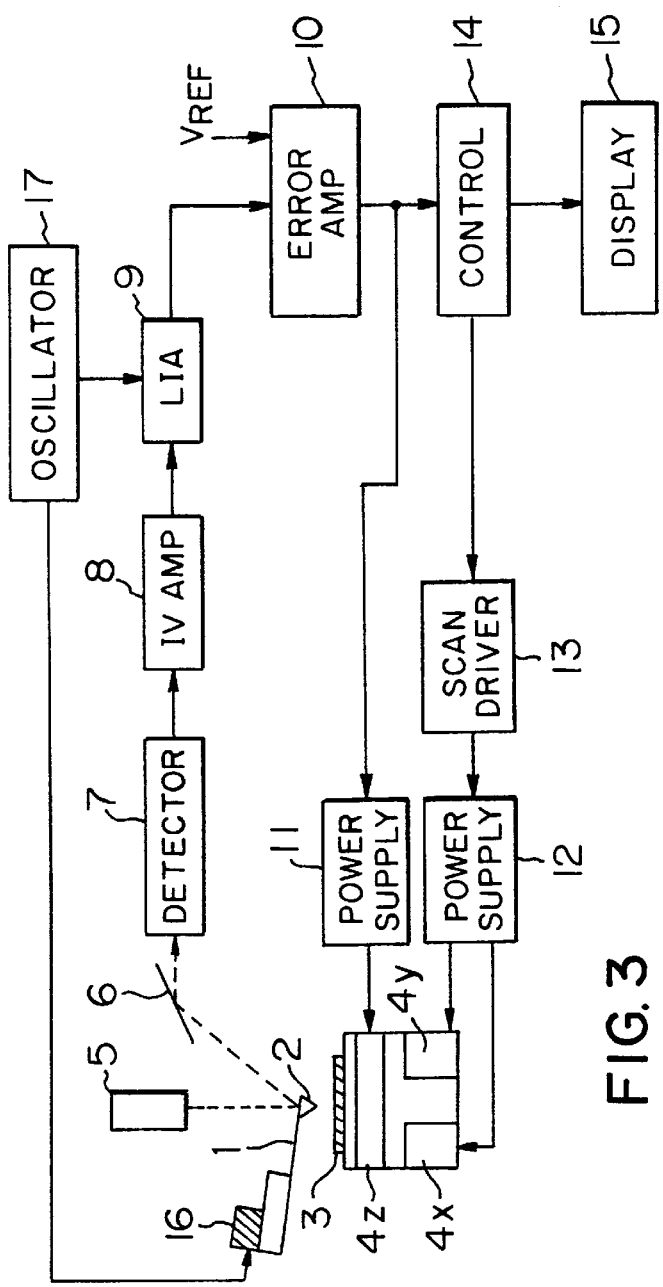
FIG. 3 is a block diagram of the prior art scanning probe microscope for producing a topographic image of a sample surface by the slope detection method.
Figure 5A:
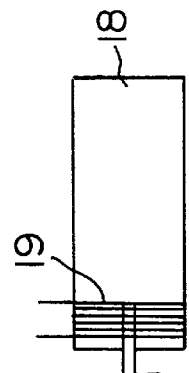
FIG. 5(a) is a plan view illustrating a method of magnetizing the cantilever, its support member, and the probe tip shown in FIG. 3 when a magnetic image of a sample surface is produced by the scanning probe microscope shown in FIG. 1.
Figure 5B:
FIG. 5(b) is a side elevation of the magnetizing structure shown in FIG. 5(a).

Referring to FIG. 1, there is shown a scanning probe microscope embodying the concept of the present invention. This microscope is designed so that its cantilever 1 is oscillated at its resonance frequency and that variations in the frequency are detected (FM detection). The microscope comprises a phase shifter 20, an amplitude controller 21, an FM demodulator 22, a low-pass filter (LPF) 23, an oscillator 24, and a lock-in amplifier (LIA) 25. It is to be noted that like components are indicated by like reference numerals in various figures and that those components which have been already described in connection with FIGS. 3 and 5(a) and 5(b) will not be described below. The optics associated with the laser light are assumed to be aligned in FIG. 1. It is further assumed that the surface of the sample 3 has a magnetic distribution.

The cantilever 1, its support member 18, and the probe tip 2 are made of a magnetic material. The coil 19 is formed around the support member 18 and supplied with an alternating current of frequency $f_m$ from the oscillator 24. Thus, the magnetic pole at the probe tip 2 is varied at the frequency $f_m$, thus magnetically producing attractive and repulsive forces. Variations in the polarity of the force gradient can be detected. The frequency $f_m$ is set lower than the resonance frequency of the cantilever 1 and higher than the response frequency of the feedback circuit driving the piezoelectric scanning element 4z for z motion. For instance, where the resonance frequency of the cantilever 1 is about 300 kHz and the response frequency of the feedback circuit driving the piezoelectric scanning element 4z is about 1 kHz, the oscillation frequency $f_m$ of the oscillator 24 may be set to approximately 10 kHz.

The cantilever 1 is vibrated at its resonance frequency due to thermal vibrations. Therefore, on the light-sensitive surface of the detector 7, the position hit by the laser light varies at regular intervals of time. That is, the output signal from the detector 7 is modulated at the resonance frequency of the cantilever 1.

Figure 4:
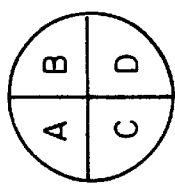
FIG. 4 is a front elevation of the photodetector of a detector 7 included in the microscopes shown in FIGS. 1 and 3.

It is assumed that the detector 7 comprises a photodetector divided into four parts as shown in FIG. 4. In this case, the calculation given by Eq. (1) above is performed. Where the detector 7 comprises a photodetector split into two parts, a calculation given by $$(X-Y)/(X+Y) \qquad (2)$$

is performed, where X and Y are the output signals from the two parts, respectively, of the photodetector. The output signal from the detector 7 is applied to the phase shifter 20 via the IV amplifier 8. The phase shifter 20 adjusts the phase in such a manner that the amplitude of the output signal is maximized. The phase shifter 20 either permits an operator to manually adjust the phase of the signal or automatically adjusts the phase by an appropriate method. The output signal from the phase shifter 20 is adjusted to a given amplitude by the amplitude controller 21 and fed back to the piezoelectric device 16 (i.e., positive feedback). In consequence, the cantilever 1 self-oscillates at its resonance frequency. As a result, the cantilever 1 and the probe tip 2 keep vibrating at an amplitude larger than that induced by thermal vibrations.

The output signal from the phase shifter 20 is also applied to the FM demodulator 22, where the FM detection is done. The output signal from the FM demodulator 22 is sent to the error amplifier 10 via the low-pass filter 23 and also to the lock-in amplifier (LIA) 25. This amplifier 25 also receives an alternating signal of the frequency $f_m$ from the oscillator 24. Accordingly, the amplifier 25 phase detects the output signal from the FM demodulator 22 by reference to the alternating signal from the oscillator 24.

In FIG. 1, as the probe tip 2 is brought close to the sample 3, an atomic or magnetic force is exerted between the atoms at the probe tip 2 and the atoms on the surface of the sample 3. At this time, if the force is an attractive force, the resonance frequency of the cantilever 1 decreases. On the other hand, if the force is a repulsive force, the resonance frequency increases. The variation in the resonance frequency appears as the output signal from the FM demodulator 22. The output signal from the FM demodulator 22 representative of the variations in the resonance frequency of the cantilever 1 contains (i) a component associated with the magnetic force exerted between the magnetic pole of the probe tip 2 and the magnetic pole of the surface of the sample 3 and (ii) a component associated with an atomic force exerted between the atoms at the probe tip 2 and the atoms on the surface of the sample 3.

The former component attributed to the above-described magnetic force is based on the oscillation frequency $f_m$ of the oscillator 24. On the other hand, the component associated with the atomic force is used for the feedback circuit driving the piezoelectric scanning element 4z. As mentioned previously, the oscillation frequency $f_m$ of the oscillator 24 is set higher than the response frequency of the feedback circuit that drives the piezoelectric scanning element 4z.

Accordingly, the low-pass filter 23 extracts only the component related to the atomic force from the output signal from the FM demodulator 22 and sends it to the error amplifier 10. The output signal from the FM demodulator 22 is supplied to the lock-in amplifier 25, which in turn phase detects the signal by reference to the output signal from the oscillator 24.

The error amplifier 10 produces the difference between the output signal from the low-pass filter 23 and the reference voltage $V_{REF}$. The output signal from the error amplifier 10 is fed to the control portion 14 and to the driving power supply 11. The error amplifier 10 controls the piezoelectric scanning element 4z for z motion via the driving power supply 11 so that the output signal from the low-pass filter 23 becomes equal to the reference voltage $V_{REF}$. It follows that the distance between the cantilever 1 and the sample 3 is kept at a distance corresponding to the reference voltage $V_{REF}$. In this structure, the cantilever 1 is allowed to vibrate up and down. Obviously, the above-described distance between the cantilever 1 and the surface of the sample 3 is the average distance.

The control portion 14 creates a topographic image of the surface of the sample 3 from the output signal from the error amplifier 10 and displays the image on the display portion 15. In addition, the control portion 14 controls the scanning driver portion 13 to scan the sample 3 in two dimensions within the x-y plane. In this way, a topographic image of the surface of the sample 3 is derived.

The operation of the instrument for obtaining a magnetic image is next described by referring to FIGS. 2(a)–2(g). It is assumed that the magnetic pole at the probe tip 2 is varied by the alternating current from the oscillator 24 as shown in FIG. 2(a). It is also assumed that the surface of the sample 3 scanned exhibits a magnetic distribution as shown in FIG. 2(c). Obviously, the magnetic pole at the probe tip 2 shown in FIG. 2(a) varies at the frequency $f_m$.

At this time, the output signal from the FM demodulator 22 changes as shown in FIG. 2(b). This signal is supplied to the lock-in amplifier 25. A signal of frequency $f_m$ is supplied as a reference signal from the oscillator 24 to the lock-in amplifier 25. Therefore, the amplifier 25 produces a positive-going signal in response to an in-phase signal. The lock-in amplifier 25 produces a negative-going output in response to an out-of-phase signal. The amplifier 25 produces a null signal in response to a neutral signal. Where the magnetic distribution on the surface of the sample 3 assumes a state as shown in FIG. 2(c), the amplifier 25 produces an output signal as shown in FIG. 2(d).

Similarly, if the magnetic distribution on the surface of the sample 3 scanned is as shown in FIG. 2(f), the output signal from the FM demodulator 22 varies as shown in FIG. 2(e). Under this condition, the output signal from the lock-in amplifier 25 changes as shown in FIG. 2(g). Consequently, the magnetic pole of the scanning position and its magnitude can be known from the output signal from the lock-in amplifier 25.

The output signal from the lock-in amplifier 25 is supplied to the control portion 14 to visualize the image. That is, a visible image is presented on the display portion 15. This enables a user to observe a magnetic image on the surface of the sample 3.

As can be understood from the description provided thus far, this scanning probe microscope is capable of producing a topographic image and a magnetic image of a sample surface simultaneously in a noncontacting manner in one measurement.

While one embodiment of the present invention has been described, it is to be understood that the invention is not limited thereto but rather various changes and modifications are possible. For example, in the embodiment described above, the reflecting mirror 6 is placed in the optical system for the laser light. The reflecting mirror 6 may be omitted, and light reflected by the cantilever 1 may be directly detected by the detector 7.

Furthermore, in the above-described embodiment, variations in the resonance frequency of the cantilever 1 are detected by the FM demodulator 22. The variations may also be detected by the so-called slope detection method.

In addition, in the embodiment described above, a so-called optical deflection detection is employed. Optical interference may be utilized to detect displacements of the cantilever. Also, the displacement-detecting optical system may be omitted by using a piezoelectric cantilever that itself can detect displacements due to force and act as an oscillator. In the latter case, a displacement of the cantilever itself can be extracted as a voltage output, thus dispensing with the detector 7 used in the above embodiment. A voltage output caused by a displacement of the cantilever itself can be supplied to the following stage of circuit.

The magnetic force can be detected more precisely by detecting the magnetic force at every sampling point (i.e., the height of the probe tip is locked every pixel).

Further, the difference between magnetic and nonmagnetic portions can be imaged by detecting a signal synchronized to a frequency twice as high as the frequency $f_m$ using lock-in techniques.

Having thus described my invention with the detail and particularity required by the Patent Laws, what is desired protected by Letters Patent is set forth in the following claims.

What is claimed is:

1. A scanning probe microscope for placing a probe tip opposite to a sample, scanning the probe tip or the sample in two dimensions to produce a physical force therebetween, detecting an amount of displacement of the probe tip relative to the sample due to the physical force, and creating a sample image from a signal representative of the detected amount of displacement, said scanning probe microscope comprising:

said probe tip consisting of a magnetic material and vibrating at a first vibrational frequency when said physical force does not act on said probe tip;

a first detection means for detecting displacements of said probe tip and producing an output signal representative of said displacements;

a second detection means for extracting a signal representative of topography of a surface of the sample from the output signal from said first detection means;

a means for displaying a topographic image of the sample according to an output signal from said second detection means;

a magnetic field application means for applying an alternating magnetic field having a frequency different from said first vibrational frequency to said probe tip;

a third detection means for extracting a signal associated with magnetism of the sample from the output signal from said first detection means; and a means for displaying a magnetic image of the surface of the sample according to an output signal from said third detection means.

2. The scanning probe microscope of claim 1, wherein said probe tip is attached to a cantilever made of a magnetic material, and wherein said alternating magnetic field is applied to said cantilever.

3. The scanning probe microscope of claim 1 or 2, wherein said probe tip is so adjusted that its amplitude is held at a given value, and wherein said second detection means detects deviation of the vibrational frequency of said probe tip from said first vibrational frequency.

4. The scanning probe microscope of claim 1 or 2, wherein said probe tip is controlled so that its vibrational frequency equals said first vibrational frequency, and wherein said second detection means detects variations in the amplitude of said probe tip.

5. The scanning probe microscope of claim 1, wherein said third detection means extracts the signal associated with the magnetism of the sample from the output signal from said first detection means by reference to a signal produced by said magnetic field application means.

6. A scanning probe microscope having a cantilever disposed opposite to a sample, a probe tip disposed opposite to the sample, and a first detection means for detecting an amount of displacement of said probe tip induced by a physical force exerted between the cantilever and the probe tip, said scanning probe microscope comprising:

a means for causing said cantilever and said probe tip to vibrate at or near their resonance frequency;

a second detection means for extracting a signal representative of variations in the resonance frequency of said cantilever from an output signal from said first detection means;

a feedback control means for controlling height of the sample according to an output signal from said second detection means, said feedback control means having a response frequency;

a magnetic field application means for applying to said cantilever and to said probe tip an alternating magnetic field of a second frequency lower than said first vibrational frequency and higher than the response frequency of said feedback control system;

a third detection means for extracting a signal dependent on said second frequency from the output signal from said first detection means; and means for creating a topographic image and a magnetic image of a surface of the sample from the output from said second detection means and from the output from said third detection means, respectively.

* * * * *

UNITED STATES PATENT AND TRADEMARK OFFICE
CERTIFICATE OF CORRECTION

PATENT NO. : 5,939,715
DATED : August 17, 1999
INVENTOR(S) : Shinichi Kitamura et al.

It is certified that error appears in the above-identified patent and that said Letters Patent is hereby corrected as shown below:

Title Page, [54] title, "Scanning Probe Microscope" should read --Scanning Probe Microscope Providing Topographic Image and Magnetic Image--.

Title Page, [22] "Filed: Feb. 27, 1997" should read --Filed: Feb. 27, 1998--.

Column 1, Line 1, "Scanning Probe Microscope" should read --Scanning Probe Microscope Providing Topographic Image and magnetic Image--.

Column 8 Line 33, Claim 6, "control system;" should read --control means;--.

Signed and Sealed this

Twenty-eighth Day of March, 2000

Attest:

Q. TODD DICKINSON

*Attesting Officer*     *Commissioner of Patents and Trademarks*

UNITED STATES PATENT AND TRADEMARK OFFICE
CERTIFICATE OF CORRECTION

PATENT NO. : 5,939,715
DATED      : August 17, 1999
INVENTOR(S): Shinichi Kitamura et al.

It is certified that error appears in the above-identified patent and that said Letters Patent is hereby corrected as shown below:

Title Page, insert:
--[30] Foreign Application Priority Data
Feb. 27, 1997 [JP]  Japan........9-43938--.

Signed and Sealed this

Sixteenth Day of May, 2000

Attest:

Q. TODD DICKINSON

*Attesting Officer*                *Director of Patents and Trademarks*